United States Patent [19]

Ohmi

[11] Patent Number: 5,589,005
[45] Date of Patent: Dec. 31, 1996

[54] SYSTEM FOR SUPPLYING ULTRAPURE WATER AND METHOD OF WASHING SUBSTRATE, AND SYSTEM FOR PRODUCING ULTRAPURE WATER AND METHOD OF PRODUCING ULTRAPURE WATER

[76] Inventor: Tadahiro Ohmi, 1-17-301, Komegabukuro 2-chome,, Aoba-ku Miyagi-ken Sendai-shi 980, Japan

[21] Appl. No.: 232,266

[22] PCT Filed: Nov. 9, 1992

[86] PCT No.: PCT/JP92/01450

§ 371 Date: May 31, 1994

§ 102(e) Date: May 31, 1994

[87] PCT Pub. No.: WO93/08931

PCT Pub. Date: May 13, 1993

[30] Foreign Application Priority Data

Nov. 8, 1991 [JP] Japan .................................. 3-320885

[51] Int. Cl.$^6$ ................. B08B 3/00; C02F 1/02
[52] U.S. Cl. ................. 134/30; 134/31; 134/26; 210/175; 210/180; 210/900
[58] Field of Search .................. 134/30, 31, 26; 210/175, 180, 900

[56] References Cited

U.S. PATENT DOCUMENTS 4,879,041  11/1989  Kurokawa et al. .................. 210/900

FOREIGN PATENT DOCUMENTS

| 60-190298 | 9/1985 | Japan . |
| 61-73333 | 4/1986 | Japan . |
| 63-305917 | 12/1988 | Japan . |
| 1-150328 | 6/1989 | Japan . |
| 2-85358 | 3/1990 | Japan . |
| 2-144195 | 6/1990 | Japan . |

*Primary Examiner*—Zeinab El-Arini
*Attorney, Agent, or Firm*—Baker & Daniels

[57] ABSTRACT

A method of washing a substrate, wherein even traces of impurities in minute and high-aspect-ratio trenches or holes can be washed and removed free from contamination by washing solution and a system and a method for producing ultrapure water, capable of producing ultrahigh pure water for using in the washing. At the intermediate portions of a piping for supplying a predetermined ultrapure water to a use point, there are provided: a first steam generating means for heating a ultrapure water for conversion into a first steam; a steam heating means for further heating the first steam for conversion into a second steam higher in temperature than the first steam; and cooling means for cooling the second steam for conversion into a second ultrahigh water.

23 Claims, 4 Drawing Sheets

SYSTEM FOR SUPPLYING ULTRAPURE WATER AND METHOD OF WASHING SUBSTRATE, AND SYSTEM FOR PRODUCING ULTRAPURE WATER AND METHOD OF PRODUCING ULTRAPURE WATER

BACKGROUND OF THE INVENTION

1. Field of the Invention

The present invention relates to a system for supplying ultrapure water and a method of washing a substrate, as well as to a system for producing ultrapure water and a method for producing ultrapure water. The present invention relates, for example, to a system for supplying ultrapure water which supplies ultrapure water which is used in the washing of substrates which are to be washed, and to a substrate washing method, as well as to a system for producing ultrapure water and a method for producing ultrapure water, in washing processes for substrates which are to be washed and require highly clean washing, such as semiconductor silicon wafers, fabricated parts for precision instruments, or the like.

2. Description of Related Art

Conventionally, the following types of solutions are known as washing solutions which are used in highly clean washing.

(1) Various surfactant solutions

By means of appropriately altering the type of surfactant, it is possible to remove a wide range of substances, and at the same time, the surface tension of the solution is reduced, and thereby, it is possible to wash the interior of trenches and holes which are minute and have high aspect ratios on the surface which is to be washed.

(2) Various organic solvents

Organic solvents such as isopropyl alcohol, acetone, ethanol, and various types of freon are particularly preferable in the removal of substances which are difficult to dissolve in water, such as skin lipids and oils, and furthermore, the surface tension of these organic solvents is low, so that it is possible to wash the interior of trenches or holes which are minute and have high aspect ratios on the surface which is to be washed.

(3) Ultrapure water

Refined municipal water, well water, water for industrial use, or the like, in which the impurities present in the water have been removed to the lowest limit possible. Such water is preferable for use as a solvent, so that it is applied to the removal of various types of water-soluble substances.

However, the following problems were present in the conventional technology which employed the washing solutions listed above.

(a) When using the solution of (1) above, surfactant molecules are adsorbed to and retained on the surface which is washed, after washing.

(b) The solution of (2) above is incapable of efficiently removing water-soluble substances, and organic solvent molecules are adsorbed to and retained on the surface which is washed, after washing. Appropriate drainage and exhaust processing is necessary after such solvents are used, so that this presents problems in terms of cost. Furthermore, as a result of the danger of fire and the like, there are restrictions in the handling thereof.

(c) The ultrapure water of (3) above is incapable of washing the interior of trenches or holes having a width of 0.5 micrometers or less and having an aspect ratio or one or more.

In view of the above circumstances, the present invention has as an object thereof to provide a method for washing substrates which is capable of washing and removing trace amounts of impurities within trenches or holes which are minute and have high aspect ratios, and which is free of contamination by the washing solution, as well as a system for producing ultrapure water and a method for producing ultrapure water which are capable of obtaining ultrapure water which is used in washing.

SUMMARY OF THE INVENTION

The system for supplying ultrapure water in accordance with the present invention is characterized in that, at the intermediate portions of a piping for supplying a predetermined ultrapure water to a use point, there are provided: a steam generating mechanism for heating a first ultrapure water for conversion into a first steam; a second heating mechanism for further heating the first steam for first steam for conversion into a second steam having a higher temperature than that of the first steam; and a cooling mechanism for cooling the second steam for conversion into a second ultrapure water.

The production method for ultrapure water for use in washing in accordance with the present invention is characterized in that a first ultrapure water is heated and converted into a first steam, the first steam is further heated and is converted into a second steam having a higher temperature, and next, the second steam is cooled.

The system for producing ultrapure water in accordance with the present invention is characterized in being provided with: a steam generating mechanism for heating a first ultrapure water for conversion into a first steam; a steam generating mechanism for further heating the first steam for conversion into a second steam having a temperature higher than that of the first steam; and a cooling mechanism for cooling the second steam for conversion into a second ultrapure water.

In addition, the method for washing substrates in accordance with the present invention is characterized in that a first ultrapure water is heated and converted into a first steam, the first steam is further heated and converted into a second steam having a higher temperature, and next, after the second steam is cooled, the cooled ultrapure water is supplied to a use point, and thereby a substrate is washed.

In other words, the present invention provides a system for supplying ultrapure water which includes a source of a first ultrapure water; a piping system connected to said source, said piping system having a use point; a steam generating means operatively connected to said piping system for heating said first ultrapure water for conversion into a first steam; a steam heating means operatively connected to said piping system between said steam generating means and said use point for further heating said first steam for conversion thereof into a second steam having a temperature higher than that of said first steam; and a cooling means operatively connected to said piping system between said steam heating means and said use point for cooling said second steam and for conversion thereof into a second ultrapure water.

Hereinbelow, the function of the present invention will be explained together with embodiment examples.

In the present invention, first, a first ultrapure water is converted into steam (first steam). The first ultrapure water may be characterized by having a resistivity of at least 18 MΩ.cm, a maximum total evaporation residue of 10 ppb, and a maximum total organic carbon of 10 ppb. A heating mechanism is normally employed as the means for conversion to the first steam. It is not absolutely necessary to heat to the ultrapure water to the boiling point during heating; the first ultrapure water may be heated to a temperature near the boiling point.

That is to say, as shown for example in FIG. 1, a first ultrapure water 8 is introduced into a vessel 9, and when the first ultrapure water is heated by heater 2, the first ultrapure water is converted into steam. This first steam is transferred to the following processes through piping 7 which is connected to vessel 9. In FIG. 1, steam generation mechanism 1 comprises vessel 9 and heater 2.

With regard to the heating mechanism, the heater may be introduced into the ultrapure water, for example; however, in order to avoid the contamination of the ultrapure water with impurities from the heater, it is preferable that a non-contact type of heating mechanism be employed. For example, it is preferable that a high frequency heater be employed.

In the present invention, the first steam is further heated, and converted to a second steam. The temperature of the second steam should preferably be 150° C. or greater, and a temperature of 170° C. or more is further preferable. In the case in which heating is conducted to such a temperature, the effect of the present invention is further increased. That is to say, the washing of trenches or holes having a higher aspect ratio becomes possible. However, the reason for this increase in the effect by heating to these temperatures or more is unclear.

The steam generation mechanism 3 for heating the first steam is provided with a vessel 10 at the intermediate portion of the piping, as shown in FIG. 2(a), and a heater 11 may be disposed in the interior thereof, and as shown in FIG. 2(b), the heater 11 may be disposed simply at the outer circumference of the piping 7. In order to avoid contamination with impurities from the heater, the structure depicted in FIG. 2(b) is preferable.

Furthermore, it is further preferable to employ a high frequency heater.

It is preferable that those portions which are in contact with the second steam comprise passivated stainless steel. In particular, it is preferable that the maximum surface roughness, i.e., $R_{max}$, of the passivated film be 0.1 micrometer or less. In addition, it is preferable that the extreme outer surface of the passivated film have chromium oxide as a main component thereof. If the structure employs such stainless steel possessing a passivated film, the effects of the invention will of course be further increased. The reason for this is unclear; however, the following reasons are inferred. That is to say, the reason why the washing of trenches or holes having a high aspect ratio becomes possible by means of the present invention is thought to be that, in the case in which ultrapure water is first converted to steam and is then heated and converted into a steam having a higher temperature, the hydrogen bonds between water molecules are weakened, and as result, the wettability thereof is increased, and the washing ability of the water is thus increased.

If at this time impurities enter the steam (in particular, the second steam) or the second ultrapure water, it is thought that the hydrogen bonds return to their original state, the wettability thereof worsens, and it is not possible for the ultrapure water to penetrate into trenches or holes having high aspect ratios, so that the washing ability worsens.

In the case of passivated film in which the surface roughness is less than 0.1 micrometer, or in the case of passivation in which the surface has chromium oxide as a main component thereof (that is to say, passivation in which the atomic ratio of Cr/Fe is greater than 1), there is little dissolution of impurity atoms from the surface thereof, and furthermore, there is little emission of impurity gasses from the surface thereof, so that there is little contamination of the steam or the ultrapure water with impurities. It is thought to be for this reason that the wettability of the ultrapure water which is obtained improves.

The formation of a passivated film having a surface roughness of 0.1 micrometers or less can be carried out in the following manner.

After electrolytically polishing the surface roughness to a level of 0.1 micrometers, the surface may be subjected to oxidation processing in an oxidizing atmosphere, and may then be subjected to reduction processing in an atmosphere of hydrogen gas. It is preferable that the reduction processing be carried out under conditions such that the hydrogen concentration is within a range of 0.1 ppm - 10%, and the temperature is within a range of 200°–500° C. In the case in which reduction processing is not conducted, even if the surface is electrolytically polished to a roughness of less than 0.1 micrometers, the roughness will reach a level of 0.5 micrometers after oxidation processing.

This formation method was separately proposed in Japanese Patent Application, No.Hei 3-212592(212592/1991).

(DESCRIPTION OF THE REFERENCES)

Figure 1:
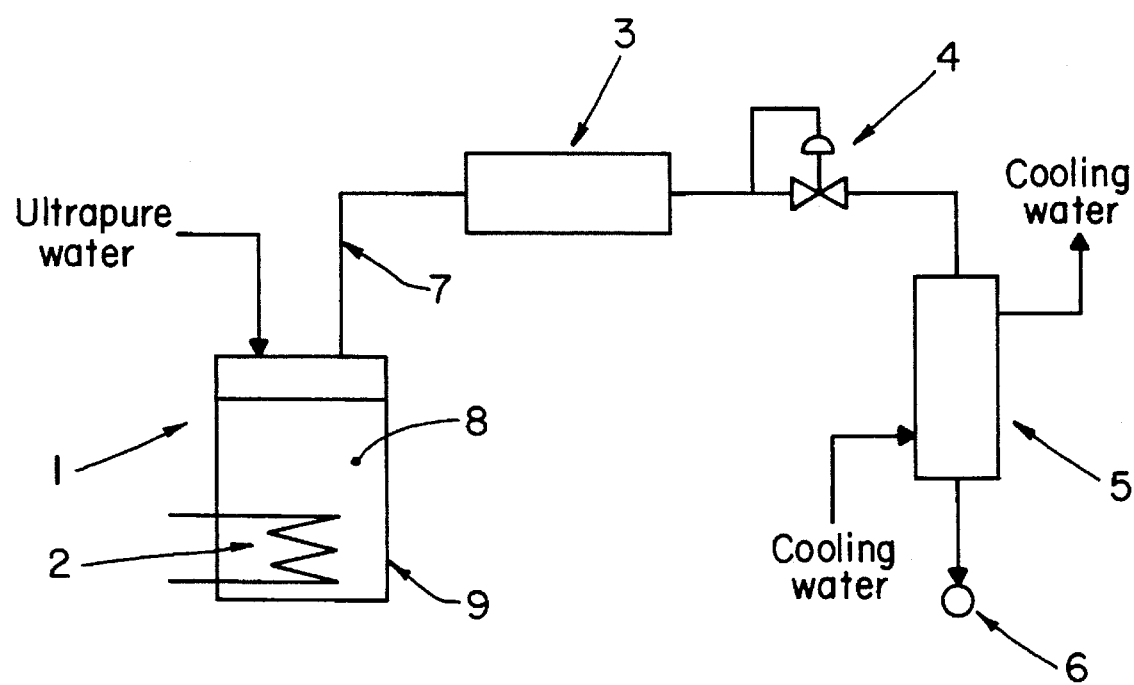
FIG. 1 is an outline diagram showing the system for producing ultrapure water in accordance with the embodiment.

Reference 1 indicates a steam generating mechanism, reference 2 indicates a heater, reference 3 indicates a steam heating mechanism, reference 4 indicates a pressure reducing valve, reference 5 indicates a water-cooling type cooler, reference 6 indicates a use point, reference 7 indicates piping, reference 8 indicates a first ultrapure water, reference 9 indicates a vessel, and reference 11 indicates a heater.

DETAILED DESCRIPTION OF THE INVENTION

Hereinbelow, an embodiment of the present invention will be explained with reference to FIG. 1.

Figure 2:
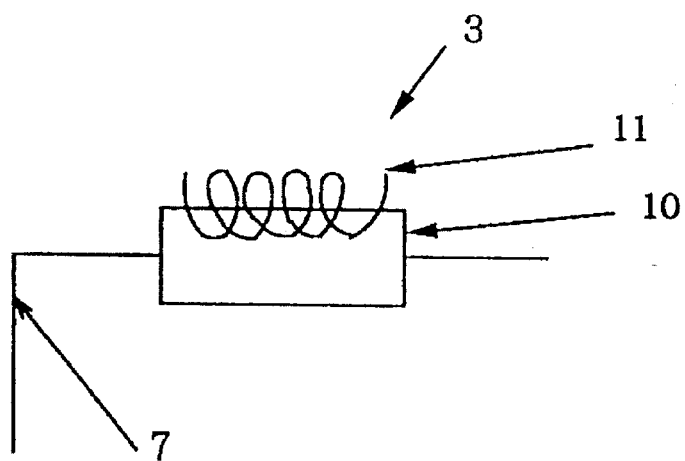
FIGS. 2(a) and 2(b) are concept diagrams showing steam heating mechanisms.
Figure 2:
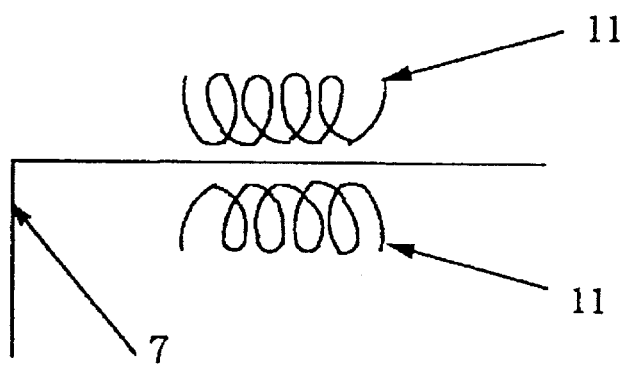

Ultrapure water (first ultrapure water) which was supplied from a conventional system for producing ultrapure water (not depicted in the Figure) was introduced into steam generating mechanism 1, and was heated to temperature of 95° C. by means of a heater 2 in the water. A first steam which was generated by steam generating mechanism 1 was further heated to a steam temperature of 170° C. by means of steam heating mechanism 3, this then passed through pressure reducing valve 4, was converted to a second ultrapure water by water-cooling type cooler 5, and was employed in the washing of a silicon wafer at use point 6. The inner surfaces of the entire structure, including the piping from the steam generating mechanism 1 to the use point 6, comprised SUS316L, which was first subjected to oxidation passivation and then was subjected to reduction processing, and the surface of the oxide passivated film comprised primarily $Cr_2O_3$. A 1 kW Teflon-coated heater was employed as the heater 2 in the water heater. As shown in FIG. 2(*b*) as second heater 3, a 1 kW heating cable comprising a silicon braid having a length of 3 meters was wrapped around the outer side of piping having an outer diameter of 1 inch and comprising SUS316L, the inner surface of which was first subjected to oxidation passivation processing, and then to reduction processing. Alternatively, the heater of FIG. 2(*a*) can be used wherein a heater 11 is disposed in vessel 10. The characteristics of the ultrapure water which was supplied to first heater 1 were such that the resistivity thereof was 18.2 MΩ.cm, the total evaporation residue was 1.0 ppb, the total organic carbon was 0.8 ppb, the dissolved oxygen was 1.1 ppb, there were 0.5 fine particles having a diameter of 0.07 micrometers per milliliter, and the solution temperature was 23.8° C., and furthermore, the characteristics of the water at the use point were such that the resistivity was 18 MΩ.cm or more, the total evaporation residue was 10 ppb or less, the total organic carbon was 10 ppb or less, the dissolved oxygen was 1 ppb, and there were 0.5 fine particles having a diameter of 0.07 micrometers per milliliter. The heating method and cooling method are not limited to those in the present embodiment; in particular, a heater operating by means of high frequency irradiation is effective as the second heater.

Figure 3:
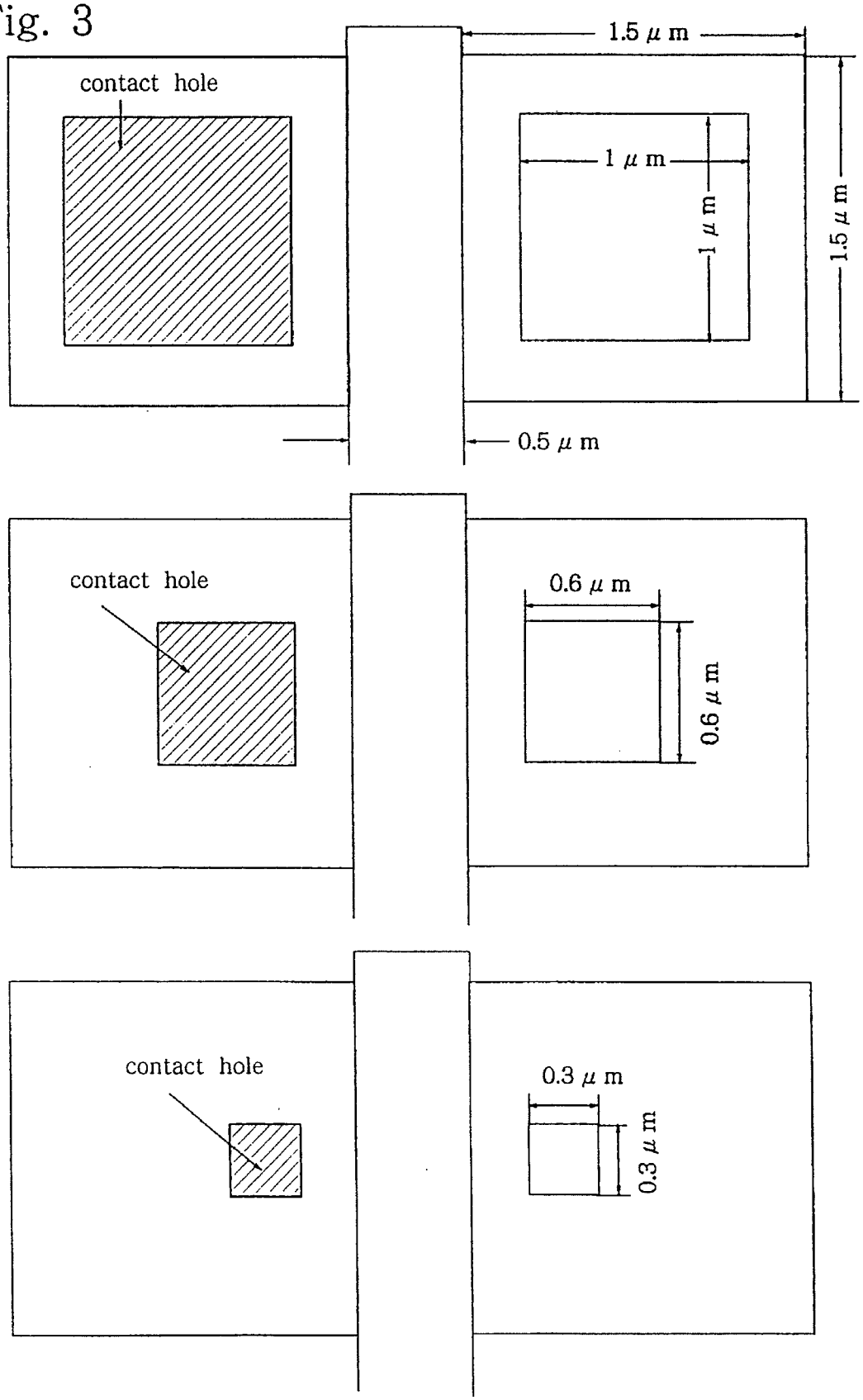
FIG. 3 is an outline plan view showing a minute MOS transistor pattern in accordance with the embodiment.

Next, in order to test the effectiveness of the present invention, a minute MOS transistor production experiment was conducted. The transistor was a N channel MOSFET, the channel length was 0.5 micrometers, the channel width was 1.5 micrometers, and 3 types of source and drain connector holes, having dimensions of 1 micrometer by 1 micrometer, 0.6 micrometers by 0.6 micrometers, and 0.3 micrometers by 0.3 micrometers, were produced on the same chip. The surface pattern thereof is shown in FIG. 3. Apart from the connector holes, production was conducted using a very small 5:1 g line stepper. With respect to the contact holes, the formation thereof was conducted using a g line stepper in the case of the 1 micrometer and 0.6 micrometer holes; however, the 0.3 micrometer contact hole was formed using Electron Beam(EB) direct writing. The opening of the contacts was conducted by means of reactive ion etching (RIE) using $CF_4$ and $H_2$ gasses. After this, the wet washing of the wafer was conducted by means of RCA washing, etching was conducted using dilute HF, and the final washing was conducted using 2 types of water: conventional ultrapure water, and the ultrapure water in accordance with the present invention. After this, Al was deposited by means of the bias sputtering method, this was subjected to patterning, and an evaluation of the characteristics was conducted, and the mutual conductance $g_m$ was evaluated. However, in order to observe the influence of the remaining impurities of the contact parts with good sensitivity, alloying annealing (sintering) was not conducted after metallization.

Figure 4:
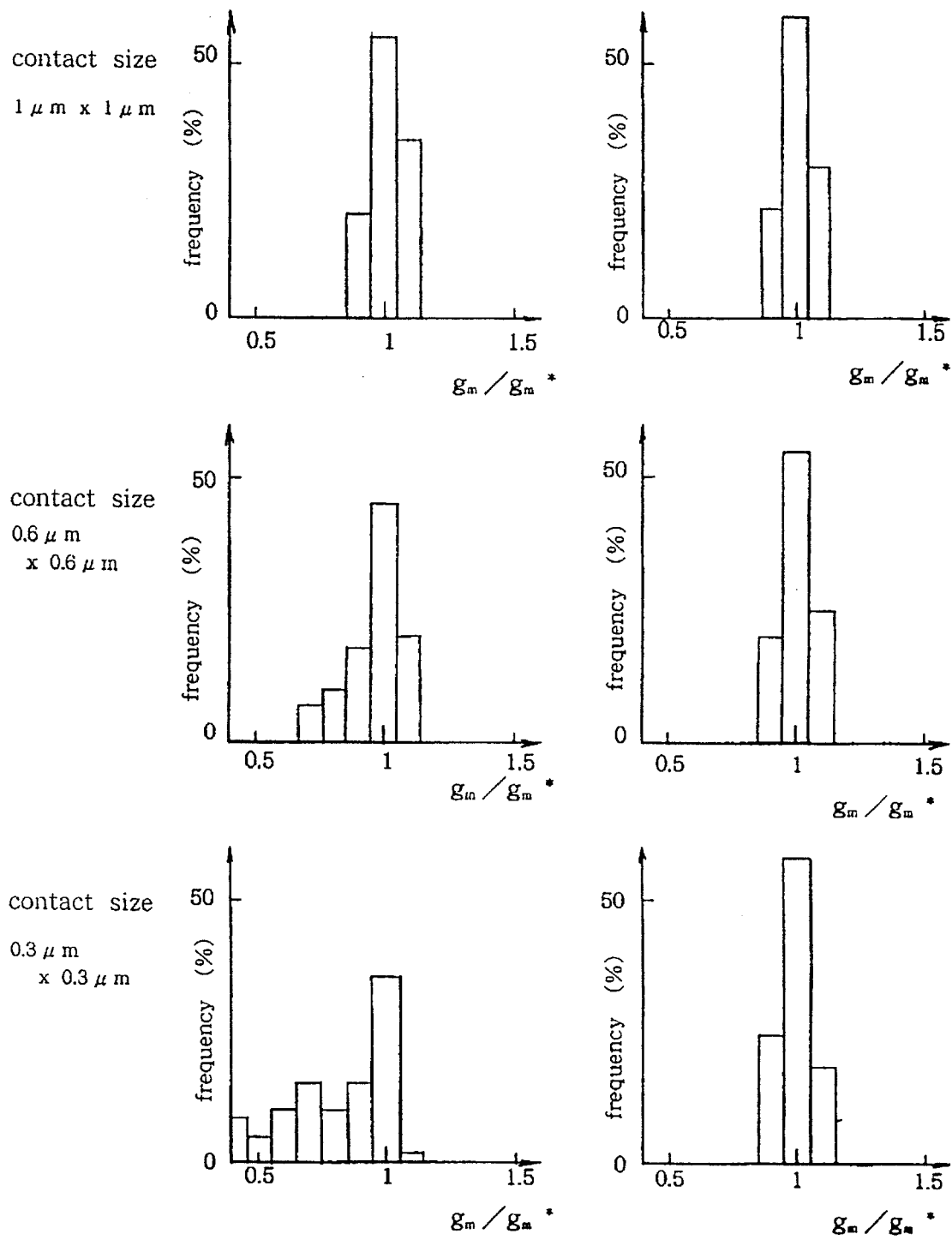
FIG. 4(a) and 4(b) contain graphs showing the dispersion in the evaluated results of the mutual conductance of minute MOS transistors in accordance with the embodiment.

The results of the evaluation are shown in FIG. 4(*a*) and 4(*b*) The evaluation was conducted with respect to a number of transistors ranging from several tens to one hundred with respect to each condition, and the observed value of $g_m$ is shown as a value standardized by the average value $g_m^*$ of each population.

As shown in FIG. 4(*a*), when conventional ultrapure water is used, in the case of the 1 micrometer contact, the dispersion of $g_m$ was small; however, as the contact size became smaller, having values of 0.6 micrometers and 0.3 micrometers, it can be seen that the dispersion on the side less than 1 becomes large. This is so because as the contact holes become smaller, the wettability of the conventional ultrapure water worsens, and sufficient washing cannot be conducted, so that the impurities remain at the bottom portions, and the electrical contact between the metal and the silicon after metallization is poor. However, in the case in which the ultrapure water of the present invention was employed in the final washing, as shown in FIG. 4(*b*), even as the contacts became small, a decline in $g_m$ could not be observed. That is to say, the impurities were sufficiently washed by means of the ultrapure water of the present invention.

In the case in which the ultrapure water of the present invention is employed, a slight dispersion in characteristics is observed independent of contact size; however, this results from a slight dispersion of the processing dimensions.

By means of the present invention, it is possible to obtain ultrapure water which has improved wettability with respect to surfaces which are to be washed, so that it becomes possible to wash and remove trace amounts of impurities, even in the interior of trenches or holes which are minute and have high aspect ratios on surfaces which are to be washed which could not be washed by conventional ultrapure water.

I claim:

1. A system for supplying ultrapure water comprising:
    a source of a first ultrapure water
    a piping system connected to said source, said piping system having a use point;
    a steam generating means connected to said piping system for heating said first ultrapure water for conversion into a first steam;
    a steam heating means connected to said piping system between said steam generating means and said use point for further heating said first steam for conversion thereof into a second steam having a temperature higher than that of said first steam; and
    a cooling means connected to said piping system between said steam heating means and said use point for cooling said second steam and for conversion thereof into a second ultrapure water.

2. A system for supplying ultrapure water in accordance with claim 1 wherein a portion of said piping system is in contact with at least one of said first ultrapure water, said second ultrapure water, said first steam and said second steam and wherein said portion comprises stainless steel covered by a passivated film.

3. A system for supplying ultrapure water in accordance with claim 2 wherein said passivated film has a maximum surface roughness $R_{max}$ of 0.1 micrometer.

4. A system for supplying ultrapure water in accordance with claim 3, wherein said passivated film is reduced in an atmosphere of hydrogen gas after oxidation processing.

5. A system for supplying ultrapure water in accordance with claim 2, wherein an extreme outer surface of said passivated film comprises an oxide having $Cr_2O_3$ as a main component thereof.

6. A system for supplying ultrapure water in accordance with claim 1, characterized in that said steam heating means comprises an electric heater.

7. A system for supplying ultrapure water in accordance with claim 1, wherein said steam heating means comprises a high frequency heater.

8. A system for supplying ultrapure water in accordance with claim 1 wherein said first ultrapure water has a resistivity of at least 18 MΩ.cm, a maximum total evaporation residue of 10 ppb, and a maximum total organic carbon of 10 ppb.

9. A method for producing ultrapure water comprising:
   supplying a first ultrapure water;
   converting said first ultrapure water into a first steam;
   further heating and converting said first steam into a high temperature second steam; and
   cooling said second steam.

10. A method for producing ultrapure water in accordance with claim 9 wherein said second steam has a temperature of at least 150° C.

11. A method for producing ultrapure water in accordance with claim 9 wherein said second steam has a temperature of at least 170° C.

12. A method for producing ultrapure water in accordance with claim 9 wherein said further heating said first steam comprises heating said first steam with an electric heater.

13. A method for producing ultrapure water in accordance with claim 9 wherein said further heating said first steam comprises heating said first steam with a high frequency heater.

14. A method for washing substrates comprising:
   supplying a first ultrapure water;
   converting said first ultrapure water into a first steam;
   further heating and converting said first steam into a second steam;
   cooling said second steam to produce a second ultrapure water;
   supplying said second ultrapure water to a use point; and
   washing a substrate with said second ultrapure water.

15. A method for washing substrates in accordance with claim 14 wherein said first ultrapure water has a resistivity of at least 18 MΩ.cm, a maximum total evaporation residue of 10 ppb, and a maximum total organic carbon of 10 ppb.

16. A method for washing substrates in accordance with claim 14 wherein the substrate is washed in a washing atmosphere comprising a gas which is inert with respect to said substrate.

17. A method for washing substrates in accordance with claim 14, characterized in that said substrate comprises a silicon wafer, at least a portion of which has a silicon metallic surface exposed.

18. A method for washing substrates in accordance with claim 14, characterized in that said substrate possesses trenches or holes having a width of less than 0.5 micrometers and having an aspect ratio of 1 or more.

19. A system for producing ultrapure water comprising:
   a source of a first ultrapure water;
   a steam generating means for heating said first ultrapure water for conversion into a first steam;
   a steam heating means for further heating said first steam for conversion thereof into a second steam having a temperature higher than that of said first steam; and
   a cooling means for cooling said second steam for conversion thereof into a second ultrapure water.

20. A system for producing ultrapure water in accordance with claim 19 further comprising a piping system for conveying said first ultrapure water, said second ultrapure water, said first steam and said second steam, a portion of said piping system directly contacting at least one of said first ultrapure water, said second ultrapure water, said first steam, and said second steam, said portion comprising stainless steel covered with a passivated film.

21. A system for producing ultrapure water in accordance with claim 20 wherein said passivated film has a maximum surface roughness $R_{max}$ of 0.1 micrometers.

22. A system for producing ultrapure water in accordance with claim 20 wherein said passivated film is formed by reduction in a hydrogen gas atmosphere after oxidation processing.

23. A system for producing ultrapure water in accordance with claim 20 wherein an outer surface of said passivated film comprises an oxide having $Cr_2O_3$ as a main component thereof.

* * * * *